United States Patent [19]

Urushima

[11] Patent Number: 5,428,617
[45] Date of Patent: Jun. 27, 1995

[54] DATA TRANSMISSION SYSTEM FOR PORTABLE TERMINAL DEVICE

[75] Inventor: Tetsuro Urushima, Yokohama, Japan

[73] Assignee: Matsushita Electric Industrial Co., Ltd., Osaka, Japan

[21] Appl. No.: 865,853

[22] Filed: Apr. 9, 1992

[30] Foreign Application Priority Data

Apr. 16, 1991 [JP] Japan .................. 3-083993

[51] Int. Cl.⁶ ............................. G06F 11/00
[52] U.S. Cl. ..................... 371/2.1; 371/20.1; 371/5.5
[58] Field of Search ............ 371/2.1, 5.5, 6, 11.2, 371/20.1, 32, 33, 34, 37.7, 37.1, 39.1, 3 8.1, 69.1, 37.8, 37.2, 37.9, 44, 45; 375/26, 34, 19, 99, 23, 94

[56] References Cited

U.S. PATENT DOCUMENTS

| | | | |
|---|---|---|---|
| 4,196,474 | 4/1980 | Buchanan et al. | 364/461 |
| 4,283,786 | 8/1981 | Okamura | 371/2.1 |
| 4,559,625 | 12/1985 | Berlekamp et al. | 371/2.1 |
| 4,630,271 | 12/1986 | Yamada | 371/37.1 |
| 4,815,106 | 3/1989 | Propp et al. | 371/67.1 |
| 4,918,746 | 4/1990 | Serizawa | 455/54 |
| 5,010,553 | 4/1991 | Scheller et al. | 371/2.1 |
| 5,022,029 | 6/1991 | Guichon | 371/2.1 |
| 5,070,503 | 12/1991 | Shikakura | 371/37.1 |
| 5,077,828 | 12/1991 | Waldroup | 455/34 |
| 5,121,395 | 6/1992 | Millar | 371/2.1 |
| 5,128,981 | 7/1992 | Tsukamoto et al. | 379/58 |
| 5,130,980 | 7/1992 | Kobayashi | 371/48 |
| 5,159,702 | 10/1992 | Aratake | 455/33.1 |
| 5,175,869 | 12/1992 | Murata | 455/66 |
| 5,285,275 | 2/1994 | Abe | 348/384 |
| 5,307,377 | 4/1994 | Chouly et al. | 371/37.4 |

FOREIGN PATENT DOCUMENTS

251923  2/1990  Japan .
2121429 5/1990  Japan .

*Primary Examiner*—Robert W. Beausoliel, Jr.
*Assistant Examiner*—Dieu-Minh Le
*Attorney, Agent, or Firm*—Stevens, Davis, Miller & Mosher

[57] ABSTRACT

A radio data communication system comprising a data conversion unit in a data transmission section and a data reverse conversion unit in a data receiving section. In the data transmission section, a control unit supplies transmission data to the conversion unit through a transmission data storage unit. The data conversion unit converts the transmission data in another data format. A radio conversion unit sends out the transmission data as a radio wave output. In the data receiving section, a radio demodulating unit receives and demodulates an radio wave input. A received data holding unit holds the received data. The data reverse conversion unit reverse-converts the data. Finally, another control unit analyzes the received data. In this way, a radio data communication system which is protected from the influence of external noise and capable of shortening a communication time can be provided.

7 Claims, 4 Drawing Sheets

FIG. IA PRIOR ART
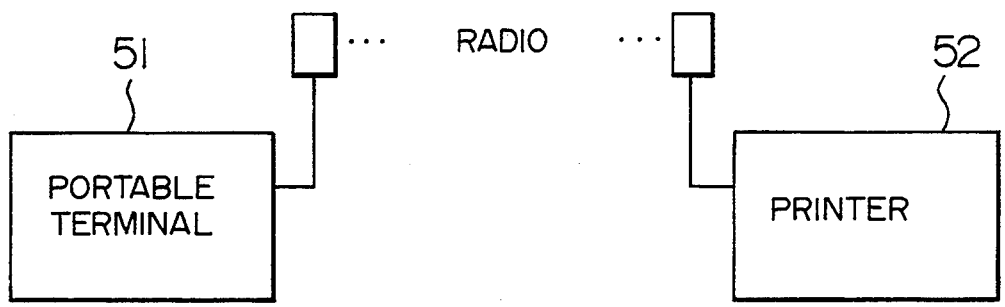
FIG. IB PRIOR ART
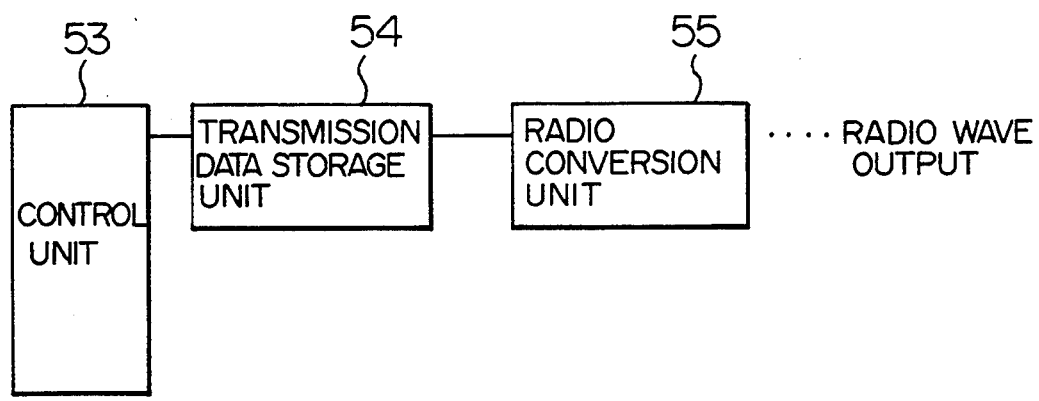
FIG. IC PRIOR ART
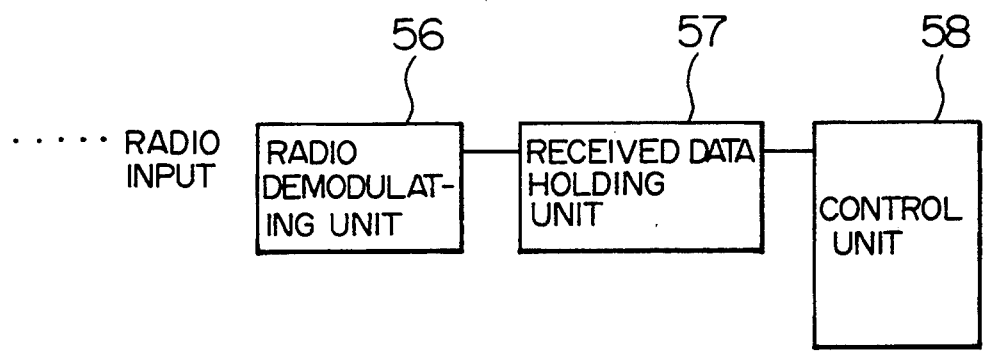

TRANSMISSION DATA 61

DATA TRANSMISSION DIRECTION ⇒

CHECKING DATA 64

NOISE 62

RECEIVED DATA

CHECKING DATA 64

DATA TRANSMISSION SYSTEM FOR PORTABLE TERMINAL DEVICE

BACKGROUND OF THE INVENTION

The present invention relates to a data transmission system for a portable terminal when the terminal body is separated from peripheral device.

Conventionally, a communication system by radio has been used. FIGS. 1A to 1C show an arrangement of the conventional data transmission system of a portable terminal. FIG. 1A shows the entire arrangement; FIG. 1B shows the arrangement of the transmission section; and FIG. 1C shows the arrangement of the receiving section. In FIGS. 1A to 1C, a portable terminal 51 is connected with a printer 52 by radio. In the transmission section, transmission data are supplied from a control unit 53 to a radio converter unit 55 through a transmission data storage unit 54 which converts the signal into radio to be sent out as a radio wave output. In the receiving section, a radio demodulation unit 56 receives and demodulates a radio wave input to be supplied to a received data holding unit 57, and finally a control unit 58 analyzes the received data.

FIG. 1D shows the data format in the conventional data transmission system. Transmission data 61 include data of "abcdefghij . . . ". Final data E1 and E2 represent data for checking. Where the transmitted data cannot be received owing to external noise 62, received data 63 include the portion of ? corresponding to "fghi". This makes it impossible to receive the transmission data correctly. Even if the transmission data are transmitted again, the external noise generated still does not permit correct communication.

In this way, in the conventional radio communication system, a great number of transmission obstacles due to external noise are generated during the communication. As the case may be, therefore, even if the transmission is repeated many times when the obstacle is generated, communication cannot be realized. As a result, in the radio communication which is always influenced by the external noise, it is an important point how the influence by the external noise should be prevented.

SUMMARY OF THE INVENTION

An object of the present invention is to solve the above problem of the conventional data communication system, and to provide a data transmission system for a portable terminal device which is protected from the influence by external noise generated.

The above object can be achieved in such a manner that the transmission time is made variable according to the frequency, time, etc., of external noise thereby to assure high transmission quality and an optimum communication time. Specifically, data to be sent out are once divided into units each composed of N characters. Thereafter, data conversion is made so that only the first character of each unit of N characters is first transmitted, subsequently only the second character of each unit is transmitted and the transmission is continued to the N-th character. In this case, data correction can be made by adding a correction bit for every N characters. Further, optimizing or shortening the communication time can be made adding the value of N before a text to be transmitted. If no response or negative response occurs for the text once transmitted, the value of N is reduced automatically gradually.

In accordance with the present invention, the data transmission side carries out data-conversion to transmit the data divided into units each composed of N characters, and adds a error correction code for data correction for each unit of N characters. The data receiving side carries out reverse-data-conversion so that even if there is any character which cannot be received owing to external noise, the data are divided to be corrected by the error correction code and the final data can be demodulated into a normal value. Additionally, if no response or negative response occurs for the text once transmitted, the data are transmitted with a reduced value of N. If normal communication always occurs, the data are transmitted with an increased value of N, thereby shortening the time required for communication.

The above and other objects and features of the present invention will be more apparent from the following description taken in conjunction with the accompanying drawings.

BRIEF DESCRIPTION OF THE DRAWINGS

FIG. 1A is a block diagram of the entire arrangement of the data transmission system according to the prior art;

FIG. 1B is a block diagram of the arrangement of the transmission section in the system of FIG. 1A;

FIG. 1C is a block diagram of the arrangement of the receiving section in the system of FIG. 1A;

DESCRIPTION OF THE PREFERRED EMBODIMENTS

Figure 1D:
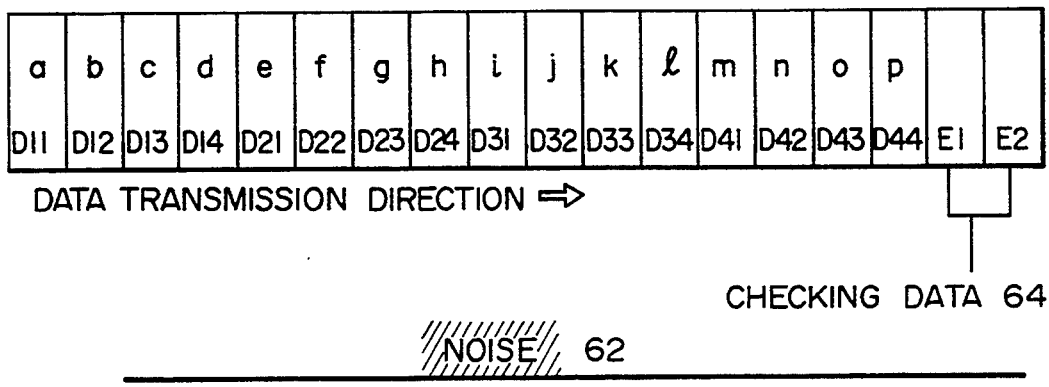
FIG. 1D is a view of the data format in the prior art system.
Figure 1D:
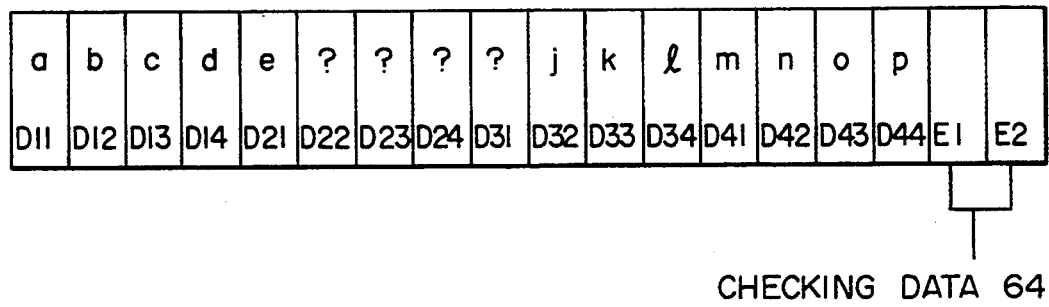
Figure 2A:
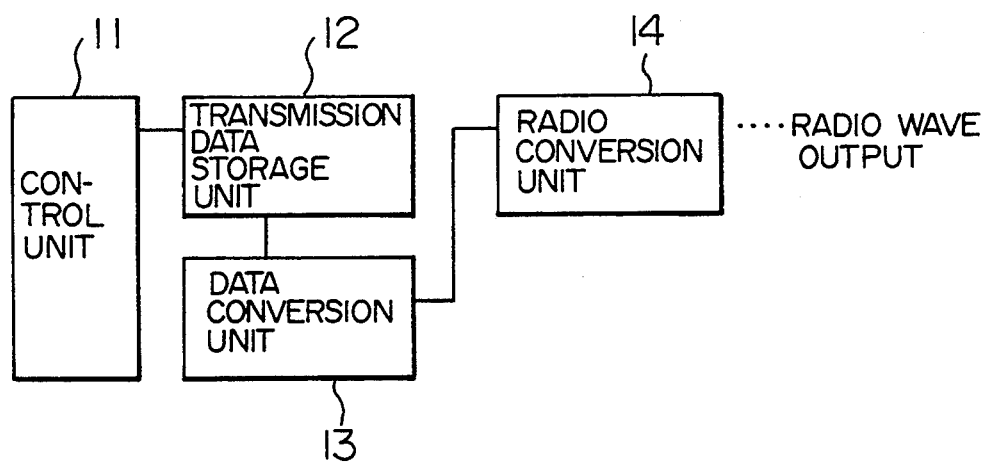
FIGS. 2A and 2B are block diagrams of the portable terminal data transmission system according to one embodiment of the present invention.
Figure 2B:
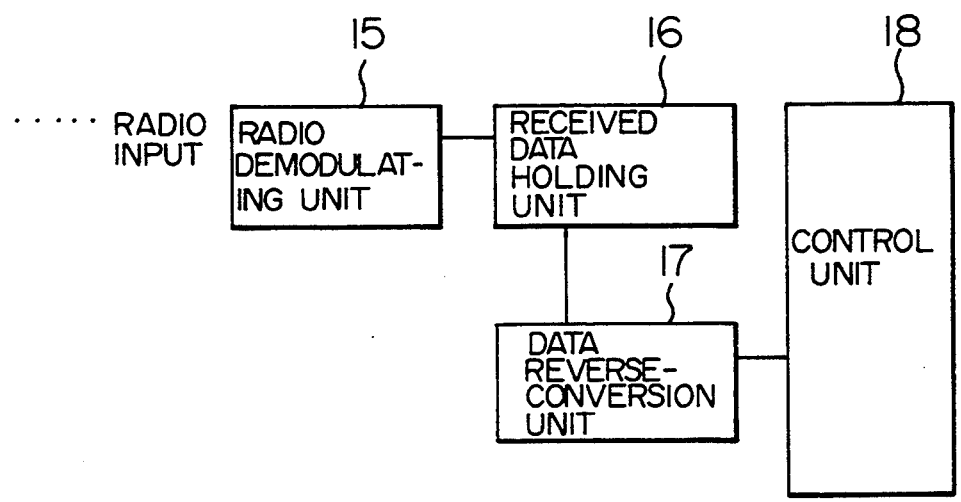

FIGS. 2A and 2B show an arrangement of the data transmission system for a portable terminal device according to one embodiment according to the present invention. Specifically, FIG. 2A shows the data transmission section, and FIG. 2B shows the data receiving section. In FIGS. 2A and 2B, 11 denotes a control unit; 12 denotes a transmission data storage unit; 13 denotes a data conversion unit; 14 denotes a radio conversion unit; 15 denotes a radio demodulation unit; 16 denotes a received data holding unit; 17 denotes a data reverse-conversion unit; and 18 denotes a control unit. The present invention is different from the prior art in that it is provided with the data conversion unit 13 and the corresponding data reverse-conversion unit 17.

In the data transmission section, the control unit 11 supplies transmission data to the data conversion unit 13 through the transmission data storage unit 12. The data conversion unit 13 carries out data conversion to supply the converted data to the radio conversion unit 14. The radio conversion unit 14 converts the data into a radio wave output to be sent out.

In the data receiving section, the radio demodulation unit 15 receives the radio wave input which is held by the received-data holding unit 16. The data reverse-conversion unit 17 carries out the data reverse-conversion for the output from the received-data holding unit 16. Finally, the control unit 18 analyzes the received data.

Figure 3:
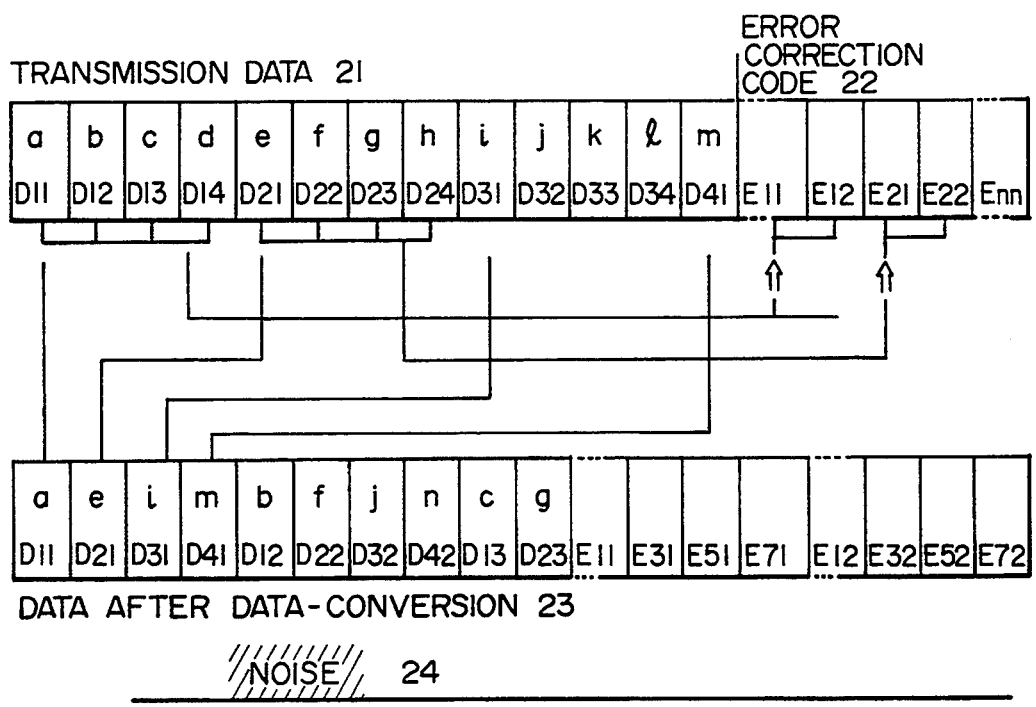
FIG. 3 is a view showing the data format in the system of FIGS. 2A and 2B.
Figure 3:
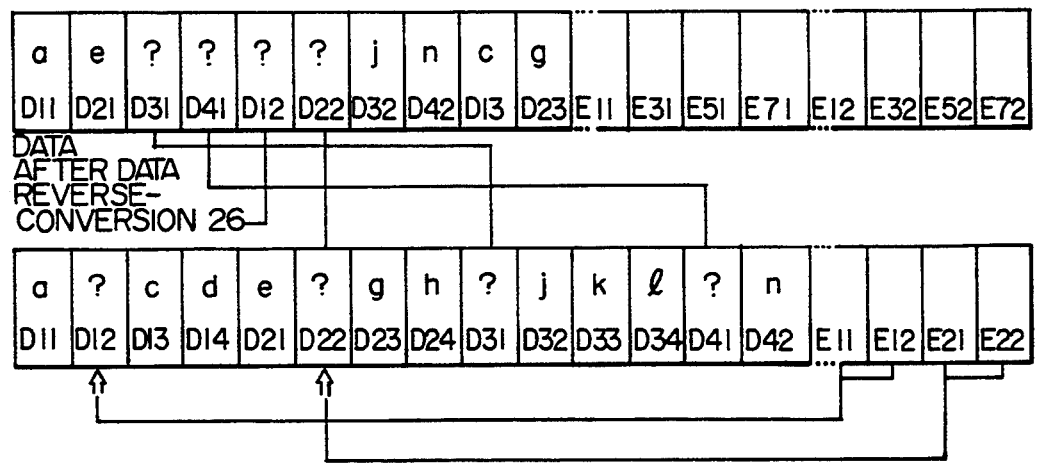

FIG. 3 shows the data format for explaining the operation of one embodiment of the present invention. In FIG. 3, 21 denotes transmission data; 22 denotes error correction codes; 23 denotes data after data conversion; 24 denotes noise; 25 denotes received data; 26 denotes data after data reverse-conversion; and 27 denotes final data.

Now referring to FIG. 3, an explanation will be given of the operation of the embodiment of the present invention.

The transmission data 21 are divided into data units each composed of 4 (four) characters. The data in each unit are labelled tentative codes D11 to D14, D21 to D24, . . . . The transmission data also include an error correction code composed of two characters E11 and E12 corresponding to D11 to D14 and another error correction code composed of two characters E21 and E22 corresponding to D21 to D24.

The transmission data thus constructed 21 are data-converted by the data conversion unit 13 in FIG. 2A to provide the data 23 with another data format. If external noise 24 enters the data while the data 23 after data conversion are transmitted by radio, characters which cannot be received by the data receiving section as in the prior art are produced. In the example shown, the received data 25 include ?'s corresponding to "imbf". If the data 25 are passed through the data reverse-conversion unit 21, they can be demodulated into data 26 which include the characters in the initial order of D11, D12, D13, . . . . Then, the positions of ? are scattered, and the corresponding data are corrected by the correction codes such as E11 and E12. This is because although the received data 25 include four successive undecodable characters, the data 26 after reverse conversion include only one undecodable character in each unit composed of four characters. Thus, the final data 27 become correct data corresponding to the original data. In this way, correct data communication can be realized by radio.

In the above embodiment, although the transmission data are divided into units each composed of four characters, they may be divided into units each composed of N (integer) characters.

As understood from the explanation of the above embodiment, the present invention has a meritorious effect that it can realize radio communication which cannot be realized by the prior art radio communication system owing to external noise. When communication abnormality due to the external noise occurs, all that the prior art system can do is to repeat the data transmission, and the abnormality cannot be automatically removed. On the other hand, the present invention can automatically correct such communication abnormality.

Additionally, in the above embodiment, two characters for error correction are allotted for four characters included in each of the units of the data (text) to be transmitted. Assuming that one character is composed of 8 bits, therefore, any error of 16 bits or less in 32 bits can be corrected completely. This is known in the CRC checking system in general data communication.

Meanwhile, noise in radio communication may occur continuously over several characters as in the embodiment of the present invention described above, or occur scatteredly at several positions. The present invention can deal with both cases. The above embodiment permits one bit error to 8 (eight) characters (64 bits) to be corrected. Since the transmission data after data conversion are transmitted by radio, errors of successive 8 (eight) characters result in errors of two characters in each unit composed of four characters; the errors of these two characters can be corrected according to the above embodiment.

If the transmission data always include two characters for error correction allotted to each unit composed of four characters as in the above embodiment, it takes a time 1.5 times as long as the normal data transmission time to transmit such data even when no external noise occurs. If the number of characters included in each unit is added to the head of the transmission data, the data receiving side can change the demodulated signal automatically. Specifically, if no response or negative response occurs for the data once transmitted from the data transmission side, the data with a reduced value of N are transmitted again. If normal data communication is always executed, the value of N may be increased. Thus, the time required for the communication can be shortened.

I claim:

1. A data transmission system comprising:
   a data transmission section which comprises means for dividing data into units, each of said units being composed of N (integer) characters including a first character, a second character, a third character, . . . and an N-th character and being supplied with an error correction code, and for transmitting the data in an order of the first character in each of said units, the second character in each of said units, the third character in each of aid units, . . . the N-th character in each of said units;
   a data receiving section which comprises means for receiving the data transmitted by the data transmission section, reconstructing the data in said units and correcting any error included in said units using said error correction code; and
   means for determining whether a response to the data once transmitted is a normal response, a negative response or no response to determine an occurrence frequency of transmission errors, for varying a value of N in each of said units according to the occurrence frequency of transmission errors in such a manner that N is set for a larger or smaller value in accordance with the occurrence frequency of transmission errors, and for causing the data to be transmitted again with a reduced value of N when the occurrence frequency of transmission errors exceeds a predetermined value.

2. A data transmission system according to claim 1, wherein at least one of said data transmission section and said data receiving section is disposed in a portable terminal.

3. A data transmission system according to claim 1, wherein said data transmission section comprises means for transmitting said data to said data receiving section by radio.

4. A data communication system comprising:
   (a) a data transmission section at a data transmission side, said data transmission section including:
       (i) means for dividing transmission data into data blocks, each of said data blocks comprising first through N-th data sub-blocks, N being an integer, said data sub-blocks of said data blocks forming a first sequence;
       (ii) means for providing each of said data blocks with an error correction code;
       (iii) means for rearranging said data sub-blocks into a second sequence beginning with said first data sub-blocks of said data blocks and ending with said N-th data sub-blocks of said data blocks; and
(iv) means for transmitting said data sub-blocks in said second sequence;
(b) a data receiving section at a data receiving side, said data receiving section comprising:
(i) means for receiving said data sub-blocks transmitted in said second sequence by said means for transmitting;
(ii) means for rearranging said data sub-blocks into said first sequence; and
(iii) means for correcting errors in said data sub-blocks by use of said error correction code provided for each of said data blocks;
(c) means for detecting a frequency of error generation in transmission of said data sub-blocks by said means for transmitting, said means for detecting comprising:
(i) transmission check means for checking whether said data sub-blocks have been correctly transmitted and for generating a normality response signal in response to a correct transmission and an abnormality response signal in response to an incorrect transmission;
(ii) no-response detection means for detecting no-response conditions in which no response occurs for the data sub-blocks; and
(iii) means for calculating said frequency of error generation as a sum of a number of said abnormality response signals generated by said transmission check means and a number of said no-response conditions and for determining whether said frequency of error generation exceeds a predetermined number;
(d) N-value control means for varying N in accordance with said frequency of error generation; and
(e) retransmission control means for controlling said N-value control means to decrease N to a decreased value and for controlling said data transmission section to retransmit a portion of said transmission data with said decreased value of N when said frequency of error generation exceeds said predetermined number.

5. A data transmission system according to claim 4, wherein said N-value control means and said retransmission control means are disposed at said data transmission side, and wherein said means for detecting said frequency of error generation is disposed at said data receiving side.

6. A data communication system according to claim 4, wherein at least one of said data transmission section and said data receiving section is disposed in a portable terminal.

7. A data communication system according to claim 4, wherein said data transmission section comprises means for transmitting said data sub-blocks to said data receiving section by radio.

* * * * *